US009503803B2

(12) United States Patent
Gauger, Jr. et al.

(10) Patent No.: US 9,503,803 B2
(45) Date of Patent: *Nov. 22, 2016

(54) COLLABORATIVELY PROCESSING AUDIO BETWEEN HEADSET AND SOURCE TO MASK DISTRACTING NOISE

(71) Applicant: Bose Corporation, Framingham, MA (US)

(72) Inventors: Daniel M. Gauger, Jr., Berlin, MA (US); Christopher B. Ickler, Sudbury, MA (US); David Bradford Ramsay, Framingham, MA (US)

(73) Assignee: Bose Corporation, Framingham, MA (US)

( * ) Notice: Subject to any disclaimer, the term of this patent is extended or adjusted under 35 U.S.C. 154(b) by 289 days.

This patent is subject to a terminal disclaimer.

(21) Appl. No.: 14/225,807

(22) Filed: Mar. 26, 2014

(65) Prior Publication Data

US 2015/0281829 A1 Oct. 1, 2015

(51) Int. Cl.
*A61F 11/06* (2006.01)
*G10K 11/16* (2006.01)
*H03B 29/00* (2006.01)
*H04R 1/10* (2006.01)
(Continued)

(52) U.S. Cl.
CPC ........... *H04R 1/1083* (2013.01); *G10K 11/175* (2013.01); *H03G 3/32* (2013.01); *H04K 3/45* (2013.01); *H04K 3/825* (2013.01); *H04K 3/42* (2013.01); *H04K 3/43* (2013.01); *H04K 2203/12* (2013.01); *H04R 5/04* (2013.01)

(58) Field of Classification Search
CPC . H04R 5/033; G10K 11/178; H04M 1/6066; H04M 1/6058

USPC .................................. 381/71.8, 71.11, 74
See application file for complete search history.

(56) References Cited

U.S. PATENT DOCUMENTS 8,019,095 B2 9/2011 Seefeldt et al.
8,199,933 B2 6/2012 Seefeldt
(Continued)

FOREIGN PATENT DOCUMENTS

EP 2002429 A1 12/2008
WO 2008138349 A2 11/2008

OTHER PUBLICATIONS

Invitation to Pay Additional Fees dated Jun. 29, 2015 for International application No. PCT/US2015/022477.
(Continued)

*Primary Examiner* — Alexander Jamal
(74) *Attorney, Agent, or Firm* — Bose Corporation (57) ABSTRACT

A media playback device has programmable signal processing capabilities and an input receiving signals representative of ambient noise. The media playback device identifies an output response characteristic and an attenuation characteristic of a set of headphones associated with the media playback device, predicts a property of audio output by the headphones at a user's ear based on the ambient noise input signal, the output response characteristic, and the attenuation characteristic of the headphones, predicts expected residual ambient noise at the user's ear, when wearing the headphones, derived from the ambient noise input signal and the attenuation characteristic, and modifies masking audio signals to be provided to the headphones such that they will mask the expected residual ambient noise at the user's ear.

16 Claims, 8 Drawing Sheets

(51) Int. Cl.
*G10K 11/175* (2006.01)
*H03G 3/32* (2006.01)
*H04K 3/00* (2006.01)
*H04R 5/04* (2006.01)

(56) References Cited

U.S. PATENT DOCUMENTS

| | | | |
|---|---|---|---|
| 8,213,624 B2 | 7/2012 | Seefeldt | |
| 8,239,050 B2 | 8/2012 | Crockett et al. | |
| 8,437,482 B2 | 5/2013 | Seefeldt et al. | |
| 8,447,047 B2 | 5/2013 | Saraoka et al. | |
| 8,504,181 B2 | 8/2013 | Seefeldt et al. | |
| 2005/0128286 A1* | 6/2005 | Richards | G06F 3/04815 348/36 |
| 2008/0268912 A1* | 10/2008 | Wang | H04M 1/6066 455/569.1 |
| 2009/0273387 A1 | 11/2009 | Howard | |
| 2010/0069114 A1 | 3/2010 | Lee et al. | |
| 2014/0301567 A1* | 10/2014 | Kim | H04R 3/04 381/94.1 |
| 2014/0307888 A1* | 10/2014 | Alderson | H04R 3/002 381/71.8 |

OTHER PUBLICATIONS

International Search Report and Written Opinion dated Sep. 3, 2015 for International application No. PCT/US2015/022477.

Ramo Jussi et al: "Perceptual headphone equalization for mitigation of ambient noise", 2013 IEEE International Conference on Acoustics, Speech and Signal Processing (ICASSP); Vancouver, BC; May 26-31, 2013, Institute of Electrical and Electronics Engineers, Piscataway, NJ, US, May 26, 2013, pp. 724-728, XP032508840, ISSN: 1520-6149, DOI: 10-1109/ICASSP.2013.6637743.

Moore B C J et al: "A Model for the Prediction of Thresholds, Loudness, and Partial Loudness", Journal of the Audio Engineering Society, Audio Engineering Society, New York, NY, US, vol. 45, No. 4, Apr. 1, 1997, pp. 224-240, XP000700661, ISSN: 1549-4950, the whole document.

Ramo Jussi et al : "Perceptual Frequency Response Simulator for Music in Noisy Environments", Conference: 45th International Conference: Applications of Time—Frequency Processing in Audio; Mar. 2012, AES, 60 East 42nd Street, Room 2520 New York 10165-2520, USA, Mar. 1, 2012, XP040574529, abstract; figures 1-9, Chapter 1-4, 6.

Seefeldt, Alan, "Loudness Domain Signal Processing," Audio Engineering Society, Convention Paper 7180, Presented at the 123rd Convention, Oct. 5-8, 2007, New York, NY, USA.

* cited by examiner

COLLABORATIVELY PROCESSING AUDIO BETWEEN HEADSET AND SOURCE TO MASK DISTRACTING NOISE

BACKGROUND

This disclosure relates to collaborative processing of audio between a headset and a source of audio, and in particular for masking distracting noise.

Headphones allow a user to be immersed in their chosen audio material without disturbing those around them, whether used with a portable audio device, such as a smart phone, or a stationary audio source, such as a home theater system or desktop computer. Limitations in current solutions include interference by ambient noise with the user's ability to enjoy their chosen content, and interference by the content itself with the user's situational awareness—their ability to hear sounds in their environment that they should hear. Wearing headphones, particularly noise attenuating headphones, while listening to audio can also—if desired—provide masking to improve the wearer's isolation from distractions. Choice of headphone alone often does not give the user the ability to achieve the level of music and ability to hear (or not) their surroundings that they desire due, in part, to limitations in the signal processing that can be afforded in a headphone design. However, many personal audio players or other audio sources have excess computational capacity that might be applied to improve upon these experiences.

SUMMARY

In general, in one aspect, a media playback device has programmable signal processing capabilities and an input receiving signals representative of ambient noise. The media playback device identifies an output response characteristic and an attenuation characteristic of a set of headphones associated with the media playback device, predicts a property of audio output by the headphones at a user's ear based on the ambient noise input signal, the output response characteristic, and the attenuation characteristic of the headphones, predicts expected residual ambient noise at the user's ear, when wearing the headphones, derived from the ambient noise input signal and the attenuation characteristic, and modifies masking audio signals to be provided to the headphones such that they will mask the expected residual ambient noise at the user's ear.

Implementations may include one or more of the following, in any combination. Modifying the masking signals may include equalizing the masking signals to have a spectral characteristic that matches a spectrum of the expected residual ambient noise at the user's ear. Modifying the masking signals may include setting a level of the masking signal to control a partial loudness of the expected residual ambient noise at the user's ear. The media playback device may modify the masking signals based on the expected residual ambient noise and the output response characteristic such that the masking signals cause the expected residual ambient noise to have a pre-determined partial loudness at the user's ear. The media playback device may additionally modify the masking signals so that the masking signals cause the residual ambient noise to have a partial loudness that increases monotonically in a pre-determined way with increases in the ambient noise level. The increase in the partial loudness of the residual ambient noise may be less than would occur if the level of the masking signals were held constant as ambient noise level increases.

Modifying the masking signals may include setting a level of the masking signal to have a predefined relationship to an average level of the expected residual ambient noise at the user's ear. The predefined relationship may be based on a user input value, and the media playback device may modify the masking signals to mask the expected residual ambient noise according to the user input value when a first set of headphones is coupled to the media playback device, and modify the masking signals to have the same predefined relationship to the average level of the expected residual ambient noise without receiving further user input when a second set of headphones having different response characteristics than the first set of headphones is coupled to the media playback device. The predefined relationship may be based on a first user input value, and the media playback device may modify the masking signals to mask the expected residual ambient noise according to the user input value when a first set of headphones is coupled to the media playback device, and modify the masking signals to have a different predefined relationship to the average level of the expected residual ambient noise based on a second user input value when a second set of headphones having different response characteristics than the first set of headphones is coupled to the media playback device. Modifying the masking audio signals may be dynamic.

Identifying the attenuation characteristic may include assuming the headphones do not attenuate the ambient noise. The media playback device may receive a user input adjusting the modification of the audio masking signals, associate the user input adjustment with a model of the headphones, and transmit data describing the adjustment and the headphone model to a server with which the media playback device is in communication. The media playback device may also identify an input response characteristic of a microphone providing the signals representative of the ambient noise, and the modification of the audio masking signals may be additionally based on the input response characteristic of the microphone. The microphone may be coupled to the headphones.

In general, in one aspect, a set of headphones outputs sounds corresponding to first and second input audio signals, the first input audio signals including masking signals. A microphone generates an ambient noise signal representing ambient noise in the vicinity of the headphones. A programmable signal processor dynamically modifies and combines the first and second input audio signals based on a combination of the input signal received from the microphone and an output response characteristic of the headphones, the modification controlling the total loudness of the combined audio signals and a relative partial loudness of each of the modified first and second input audio signals within the combined audio signal.

Implementations may include one or more of the following, in any combination. The signal processor may control the relative partial loudness of the first and second audio signals to a first relative value in a first mode of operation of the headphones and to a second relative value in a second mode of operation of the headphones. The first relative level may place the first audio signal in the foreground and the second audio signal in the background of the total perceived audio environment, and the second relative level may place the second audio signal in the foreground and the first audio signal in the background of the total perceived audio environment. The signal processor may be configured to modify and combine the first and second input audio signals differently for each of first and second earphones of the set of headphones. The signal processor may be integrated into the set of headphones.

In general, in one aspect, a set of headphones output sounds corresponding to input audio signals, providing at least 12 dBA attenuation of ambient sound at a user's ear. A programmable signal processor provides a signal that when reproduced by the set of headphones provides a masking sound at the user's ear with a spectral density that is flat from 200 Hz to 500 Hz, falls off with a slope of about 8 dB/octave above 500 Hz, and falls off with a slope of about 20 dB/octave below 100 Hz.

Implementations may include one or more of the following, in any combination. A microphone may generate an ambient audio signal representing the ambient noise in the vicinity of the headphones, and the signal processor may provide the masking sound at a level such that resulting partial loudness of the residual noise at the user's ear is at least ten times less than the residual noise level in the absence of the masking sound. The signal processor may be integrated into the set of headphones.

In general, in one aspect, a media playback device has programmable signal processing capabilities and an input receiving signals representative of ambient noise. The media playback identifies an output response characteristic and an attenuation characteristic of a set of headphones associated with the media playback device, and dynamically modifies audio output signals to be provided to the headphones based on a combination of the output response characteristic, the attenuation characteristic, and the ambient noise input signal.

Implementations may include one or more of the following, in any combination. The media playback device may modify the audio output signals by predicting a property of audio output by the headphones at a user's ear based on the ambient noise input signal, the output response characteristic, and the attenuation characteristic of the headphones. The predicted property of the audio output at the user's ear may include the partial specific loudness of the audio output by the headphones in the presence of expected residual ambient noise at the user's ear derived from the ambient noise input signal and the attenuation characteristic, and the media playback device may modify the audio output signals by adjusting the level of and equalizing the audio output signals to maintain a partial specific loudness that is approximately the specific loudness that would result from outputting the audio output signals in the absence of the ambient noise. The partial loudness of the audio output signal may be maintained to differ by a controlled amount from a derived partial loudness of the expected residual ambient noise. The partial loudness of the audio output signal may be maintained to differ by a controlled amount from a derived specific loudness of the expected residual ambient noise within a sub-band of the audible spectrum.

The audio output signals provided by the media playback device may include entertainment content, and the media playback device may modify the audio output signals such that when they are combined with the expected residual ambient noise at the user's ear, the partial specific loudness and spectral balance of the entertainment content are approximately as they would be in a quiet environment. The media playback device may modify the audio output signals by adjusting a property of the audio output signals within multiple frequency bands to maintain a minimum signal-to-noise ratio of the audio output by the headphones at a user's ear to expected residual ambient noise at the user's ear derived from the ambient noise input signal and the attenuation characteristic in each of the frequency bands. The adjusted property of the audio output signal may be the level of the signal. The adjusted property of the audio output signal may be the dynamic range of the signal.

The media playback device may identify a model of the headphones, and receive data describing an adjustment to the modification of the audio output signals from a server with which the media playback device is in communication. The media playback device may modify the audio output signals by instructing a codec circuit to make adjustments to signals passing through it. The attenuation characteristic may be the attenuation of the headphones with respect to the ambient noise input signals and may includes one or more of passive attenuation of the headphones and attenuation provided by an active noise reduction system in the headphones. Data characterizing the output response characteristic may be received in the form of data provided from the headphone to the media playback device. The media playback device may retrieve data characterizing the output response characteristic from a memory based on an identification of the headphone model. The memory may be located in a remote server with which the media playback device is in communication. The media playback device may receive the identification of the headphone model as data from the headphone. The media playback device may determine the identification of the headphone model by probing electrical properties of the headphone and comparing the probed electrical properties to stored data associated with a plurality of headphone models. The input of the media playback device receiving signals representative of ambient noise may include a microphone input of an interface between the media playback unit and the headphones.

In general, in one aspect, a system for providing automatically adjusted audio output signals to a user includes a media playback device having programmable signal processing capabilities, a set of headphones for outputting sounds corresponding to audio output signals provided by the media playback device, and a microphone for providing an ambient noise input signal representing ambient noise in the vicinity of the headphones. The media playback device identifies an output response characteristic and an attenuation characteristic of the headphones, and dynamically modifies the audio output signals provided to the headphones based on a combination of the output response characteristic, the attenuation characteristic, and the input signal received from the microphone.

Implementations may include one or more of the following, in any combination. The media playback device may also identify an input response characteristic of the microphone, and the modification of the output audio may be additionally based on the input response characteristic of the microphone. The media playback device may modify the audio output signals by predicting a property of the sound output by the headphones at the user's ear based on the ambient noise input signal, the output response characteristic, and the attenuation characteristic of the headphones. The headphones may receive the audio output signals from the media playback device wirelessly. The microphone may be coupled to the headphones.

In general, in one aspect, a set of headphones output sounds corresponding to first and second input audio signals, a microphone generates an ambient noise signal representing ambient noise in the vicinity of the headphones, and a programmable signal processor dynamically modifies and combines the first and second input audio signals based on a combination of the input signal received from the microphone and an output response characteristic of the headphones. The modification controls the total loudness of the combined audio signals and a relative partial loudness of each of the modified first and second input audio signals within the combined audio signal.

Implementations may include one or more of the following, in any combination. The first input audio signal may include active hear through signals from an active noise reduction circuit, and the second audio signal may include audio signals from an external source. The signal processor may be configured to control the relative partial loudness of the first and second audio signals to a first relative value in a first mode of operation of the headphones and to a second relative value in a second mode of operation of the headphones. The first relative level may place the first audio signal in the foreground and the second audio signal in the background of the total perceived audio environment, and the second relative level may place the second audio signal in the foreground and the first audio signal in the background of the total perceived audio environment. The signal processor may be configured to modify and combine the first and second input audio signals differently for each of first and second earphones of the set of headphones. The signal processor may be integrated into the set of headphones.

Advantages include providing audio signals for entertainment and for masking the ambient environment that are tailored to the specific response characteristics of the headphones, allowing the user to hear what they wish to hear, and not hear what they do not wish to hear.

Other features and advantages will be apparent from the description and the claims.

BRIEF DESCRIPTION OF THE DRAWINGS

FIGS. 2 through 10 show graphs comparing various attributes of different sounds.

DESCRIPTION

There are millions of people who spend time every day listening to music and other media from computers, portable audio players, and smartphones over headphones. Ambient noise can interfere with a user's ability to enjoy music with a correct frequency balance at the level the user wants. Turning up the level of the audio to overcome the ambient noise may result in a playback level that is unpleasant, and still not provide a correct perceived frequency balance of the original material. In the same way, for spoken word content, ambient noise can interfere with the intelligibility of the content at comfortable listening levels. Conversely, music can interfere with situational awareness by masking other sounds from the environment. If all the user wants is to be isolated and to hear just his music, headphones that substantially block ambient sound are appropriate; if he wants to hear and be aware of his surroundings as well as his music then headphones that intrinsically have (or can be switched to a mode that provides) little sound blocking are more appropriate. What any individual user wants to hear at a given time, only they know. A user may want to feel connected with their surroundings with a bit of quiet but properly reproduced music as a personal soundtrack for their day. Another user, or the same user at another time, may want to be immersed head-down in what they're listening to or doing with audio obliterating any distractions around them. The technology described herein intermediates between auditory inputs to let users hear what they want, when they want it, placing each input in a desired "place"— foreground, background, or not heard.

Several types of signal processing may be used to produce the effects mentioned above. Upward compression adjusts the dynamic range of an audio signal, for example, by raising the level of quiet passages without also raising the level of louder passages, so all parts can be heard properly in the presence of ambient noise, without the discomfort during loud passages that would result from just raising the total volume. Compression is dynamic, meaning that the amount of gain varies over time, based on the signal levels or spectrum of the source content. Another type of processing, called loudness compensation, upward-compresses only the low frequency content of the source, to maintain perception of the proper relative loudness of different frequencies as source volume is turned down.

Dynamic noise compensation (DNC) extends the idea of compression to adjust the dynamic range of an audio signal to account for the effects of external noise as well as the level or spectrum of the source content. DNC may also adjust the equalization of the signal. A DNC system may provide different amounts of compression in different frequency bands within the source signal, based on both the level of the source signal and the relative level and spectra of both the source signal and the noise. As such, DNC subsumes the function of loudness compensation, while also adjusting for how ambient noise degrades perception of any part of the source signal spectrum. DNC may also adjust the equalization with volume level, for example, by increasing the gain for low frequency sounds at a faster rate than for higher frequency sounds, for a given increase in the volume level set by the user. While this type of signal processing can be provided by a digital signal processor (DSP) integrated into a set of headphones, such integration increases the cost of the headphones. In situations where the processing electronics are powered by batteries, such as in most noise cancelling headphones, increasing the amount of processing also has the effect of lowering the battery life. In contrast, smartphones and other portable computing devices, such as tablet computers and portable music players, often have spare processing capacity that can be used while playing back audio content. Providing signal processing in the device providing the audio signals also allows such approaches to be used with non-powered headphones. On the other hand, some of the techniques discussed do not depend on the audio content, and providing them within the headphones can provide a degree of freedom from being tied to a particular source device.

Techniques such as dynamic compression and DNC in headphones can be provided by a digital signal processing algorithm which has knowledge of the electro-acoustic properties of the headphones and knowledge of the ambient sound. Given this information, the sound pressure at the ear due to the ambient sound and due to audio inputs to the headphone can be estimated. The resources to execute such an algorithm may be available in the combination of a music player implemented in a computing device, such as a smart phone, programmed to implement the algorithm, and a headphone having built-in microphones that make signals available to the computing device, such as from a communications microphone. Microphones used for feed-forward noise reduction may also be used, if accommodation is made for providing the signals from those microphones to the computing device. In some examples, microphones on the computing device are used to determine the ambient sound, but this is generally not reliable because computing devices, i.e., smart phones, tend to be kept in user's pockets. We refer throughout this disclosure to "headphones" without limiting whether or not the headphones in question include communication microphones (making them "headsets"), except where such microphones are being specifically discussed. Unless stated otherwise, we assume that at least one microphone signal representing ambient sound in the environment of the headphones is available to the computing device without limitation as to where that microphone is located or how it communicates with the computing device.

Figure 1:
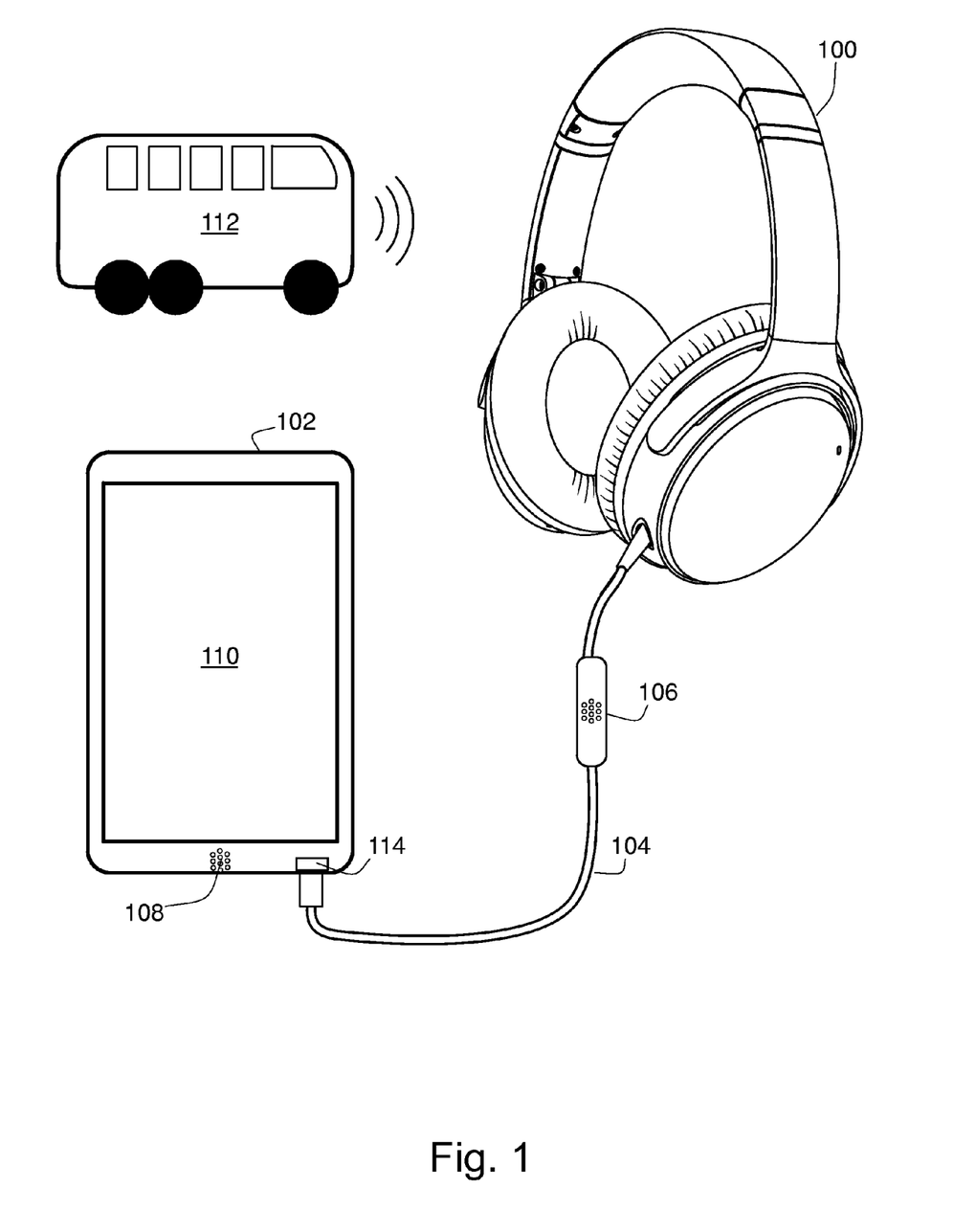
FIG. 1 shows a set of headphones connected to a computing device.

Reference is made generally to FIG. 1, in which a set of headphones 100 is coupled to a computing device 102, such as a smart phone. In the example of FIG. 1, the connection is made using a cable 104, but such connection may also be wireless, using a protocol such as Bluetooth® or WiFi®, or some other wireless protocol. A microphone 106 along the cable is used for voice communications. Such a microphone may alternatively be integrated into the headset, on the outside of the ear cup or at the end of a boom, to name two examples. The microphone may also be absent, and a microphone 108 of the computing device used if the user wishes to communicate verbally. The computing device will generally include a processor (not shown), a memory (not shown), and a user interface, shown in FIG. 1 as a touchscreen 110. The computing device is also likely, especially if it is a smart phone, to have one or more radios (not shown) for communicating with data networks, which may include the telephone network and Internet over a cellular radio, a local area network using WiFi or similar protocols, and a personal area network using Bluetooth or similar protocols. Of course, local and personal area networks may also provide connections to the telephone network and Internet if another device in the network serves as a bridge or router. Ambient noise is represented by a noise source 112.

Several electro-acoustic properties of the headphone 100 are relevant to the processing algorithms described. These include output sensitivity, which we define as sound pressure level (SPL) at the ear for a given electrical signal input level, attenuation of the ambient sound (active or passive), and input sensitivity of the microphone 106, i.e., the signal level output by the microphone for a given diffuse ambient SPL (not the wearer's voice) at the microphone diaphragm. Preferably the sensitivities are specified as responses as a function of frequency rather than as single values describing the overall output or input gain. Ultimately, what the algorithms discussed below need is an estimate of what the user hears due to ambient noise less the attenuation of the headphone (i.e., the residual noise), and due to the audio (music or masker signal) being played, through the audio response of the headphone. If A is the spectrum of the audio signal in a given time-frame and Ha is the average output sensitivity to audio, then Ha*A is the spectrum of the audio at the ear. If Hm is the average input sensitivity of the headset microphone as connected to the device, N is the measured microphone output due to ambient noise (when the user is not talking) and Htl is the average noise attenuation (transmission loss) of ambient sound reaching the ear relative to ambient sound at the headset microphone, then Hm*N/Htl is an estimate of the noise spectrum at the ear. These two spectra (Ha*A and Hm*N/Htl) are the primary inputs needed.

The computing device 102 may be made aware of these properties in several ways. If digital communication is possible from the headphones to the computing device, such as over the cable 104 or wirelessly, the headphones 100 may simply inform the computing device 102 of their properties, i.e., Ha, Hm, and Htl, using some pre-determined data format, or the headphones 100 may inform the computing device 102 of their identity by model or type, allowing the computing device to look up the needed properties in an on-board or on-line data storage. An identification signal does not need to be based on sophisticated communications—it may simply be coded by a combination of impedances between conductors in the cable 104 connecting the microphone 106 to an audio jack 114 on the computing device 102, to name one example. If the headphones 100 cannot communicate such information to the computing device 102, the computing device may identify the headphones on its own, by measuring impedance or other characteristics of the headphones when they are connected to the computing device's audio jack 114. A method for extremely precise identification of audio devices using measurements of complex impedance is described in U.S. Pat. No. 8,063,698, the contents of which are incorporated by reference, but simpler measurements such as DC resistance may be sufficient. In some cases, the user may manually specify the model or type of headphone using user interface 110 or manually enter sensitivity and transmission loss values that were provided with the headphone. In some examples, the audio system may be configured to only work with a given headphone, such as through the use of a non-standard connector, in which case it can assume that the properties of the headphone are those belonging to the only headphone that it works with. In general, we say the computing device 102 "identifies" the properties to encompass any method by which it may discover them or make a reasonable assumption about them.

In some cases, merely identifying the model of a headphone is not sufficient, because variations between components, especially microphones and speakers, may affect performance. A headphone may store parameters such as microphone sensitivity values based on individual tuning at the time of manufacture, and make this information available to the computing device. The parameters may also be measurable by probing the electrical properties of the speakers and microphone from the computing device, in the manner described in the above-referenced patent, to name one example. Once the computing device is aware of the headphones' electro-acoustic properties and has access to a measurement of the ambient noise, there are several ways to implement signal processing techniques such as those mentioned above to let users hear what they want.

One feature that can be provided by signal processing, given knowledge of the headphone's properties and the ambient noise, is automatic masking. Automatic masking involves providing an audio signal, called the masker signal, that is just loud enough to mask other ambient noises, while being as quiet as possible to minimize annoyance or distraction caused by the masker signal itself.

Figure 2:
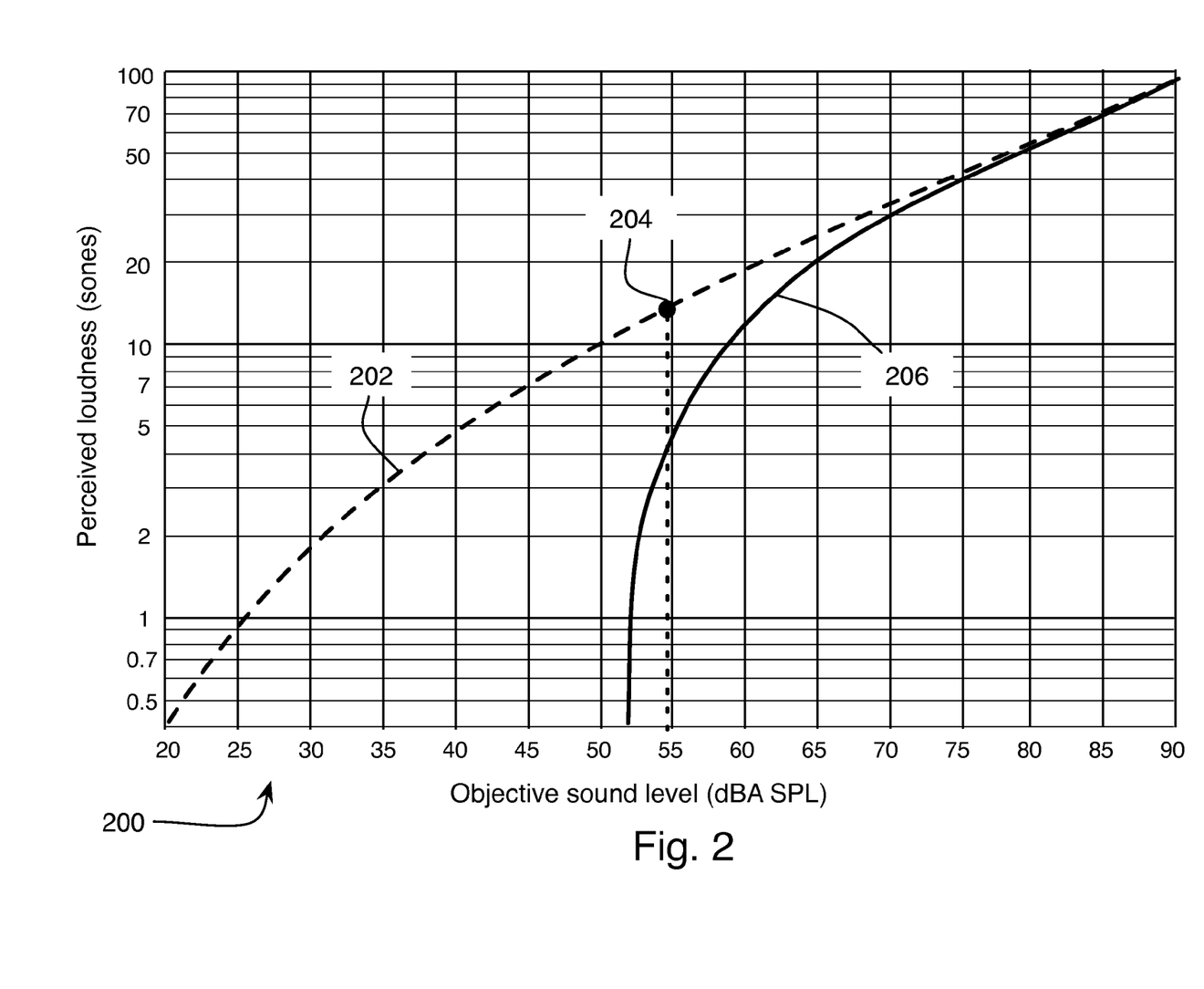

FIG. 2 shows a graph 200 illustrating the psychoacoustic phenomenon of noise masking. The X-axis represents the objective sound pressure level (SPL) of the sound and the Y-axis represents the perceived loudness of the sound in sones for a typical human listener. The dashed line 202 represents the relationship between objective SPL and perceived loudness for ambient sound, in the case that ambient sound is the only signal present. Over a wide range of levels there is a linear relationship between the SPL in dB (or as shown, dBA, since A-weighting is commonly used) and the logarithm of the loudness in sones, with the loudness approximately doubling for every 10 dB increase in level. The dashed line 202 was calculated using Moore's model for loudness, assuming an ambient noise spectrum corresponding to long-term average human speech. (Moore, Glasberg and Baer, "A Model for the Prediction of Thresholds, Loudness, and Partial Loudness", J. AES Vol. 45, No. 4, April 1997). In the figure the assumed environment surrounding the listener is one where people are talking, resulting in distraction from focused reading, writing or thought. We refer to the residual ambient noise the listener hears as the "distractor." The dashed line 202 represents the distractor loudness-level relationship. The dot 204 represents another sound, a steady, non-distracting "masker" that is also heard. In FIG. 2, the masker has a level of 55 dBA, as shown by its horizontal position. The solid 206 line represents how the listener perceives the distractor, in the presence of the masker—as described by the partial loudness aspect of Moore's model. This figure illustrates how masking is sometimes used in office systems, with a steady sound (commonly called "white noise" though the spectrum is usually not actually white) being used to reduce distraction from nearby conversations.

When the distractor and masker are (for this spectrum) at the same objective level of 55 dBA, the perceived loudness 206 of the distractor is reduced to about one-third by the presence of the masker, from about 15 sones to about 5 sones. For lower distractor levels, the perceived loudness rapidly falls toward inaudibility. A system that knows the spectrum and level of a distracting ambient environment can thus automatically adjust a masker to make the distractor essentially inaudible, with the quietest possible masker sound. For a simple automated system, given a measurement of the ambient sound level and the response of the headphones, a masker level can be set such that the level of the masker at the ear, in dB, is appropriate to mask the ambient noise, based only on the predicted average or RMS level of the residual noise at the ear. More advanced processing can be used to base masking on models of perceived loudness and the spectrum of the noise, as described below.

Figure 3:
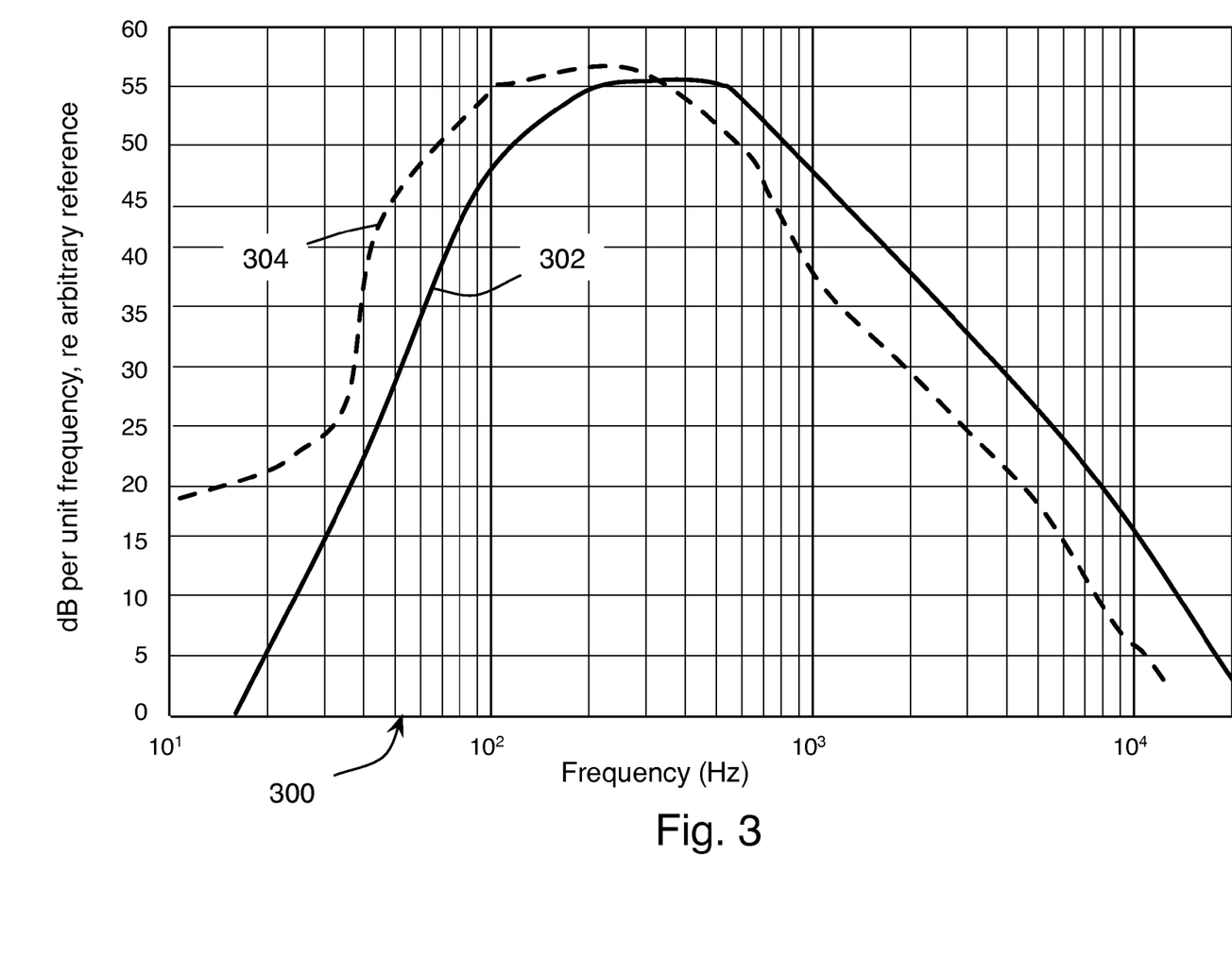

Better, more effective overall masking may be provided if the masking noise has a spectrum identical or similar to the ambient distractor, allowing the masking sound to be only as loud as necessary to provide the desired amount of masking across the spectrum. To match the masking sounds to the spectrum of the noise, the masking sounds may be preselected based on the expected noise, or they may be dynamically shaped. For a person attempting to perform a mental task, such as reading or writing, the most common distraction is the voices of people talking around them. Steady sounds, such as from an HVAC system or from an aircraft engine, may be annoying and want to be quieted, but they usually don't command attention. As such, an ideal spectrum for masking to avoid distraction if a stationary, non-adapting signal is to be used approximates the long-term average spectrum of human speech, as shown by graph 300 in FIG. 3. A solid line 302 shows a power spectrum (dB per unit frequency) that is flat from 200 to 500 Hz, falls off with a slope of about 8 dB/octave above 500 Hz, and falls off with a slope of about 20 dB/octave below 100 Hz. Masking signals typically used in open office masking systems often have a spectrum similar to this in shape, but shifted to lower frequencies, as shown in the dashed line 304 in the figure, which makes the noise more comfortable to listen to at higher levels. Note that both spectra in FIG. 3 are smoothed.

Figure 4:
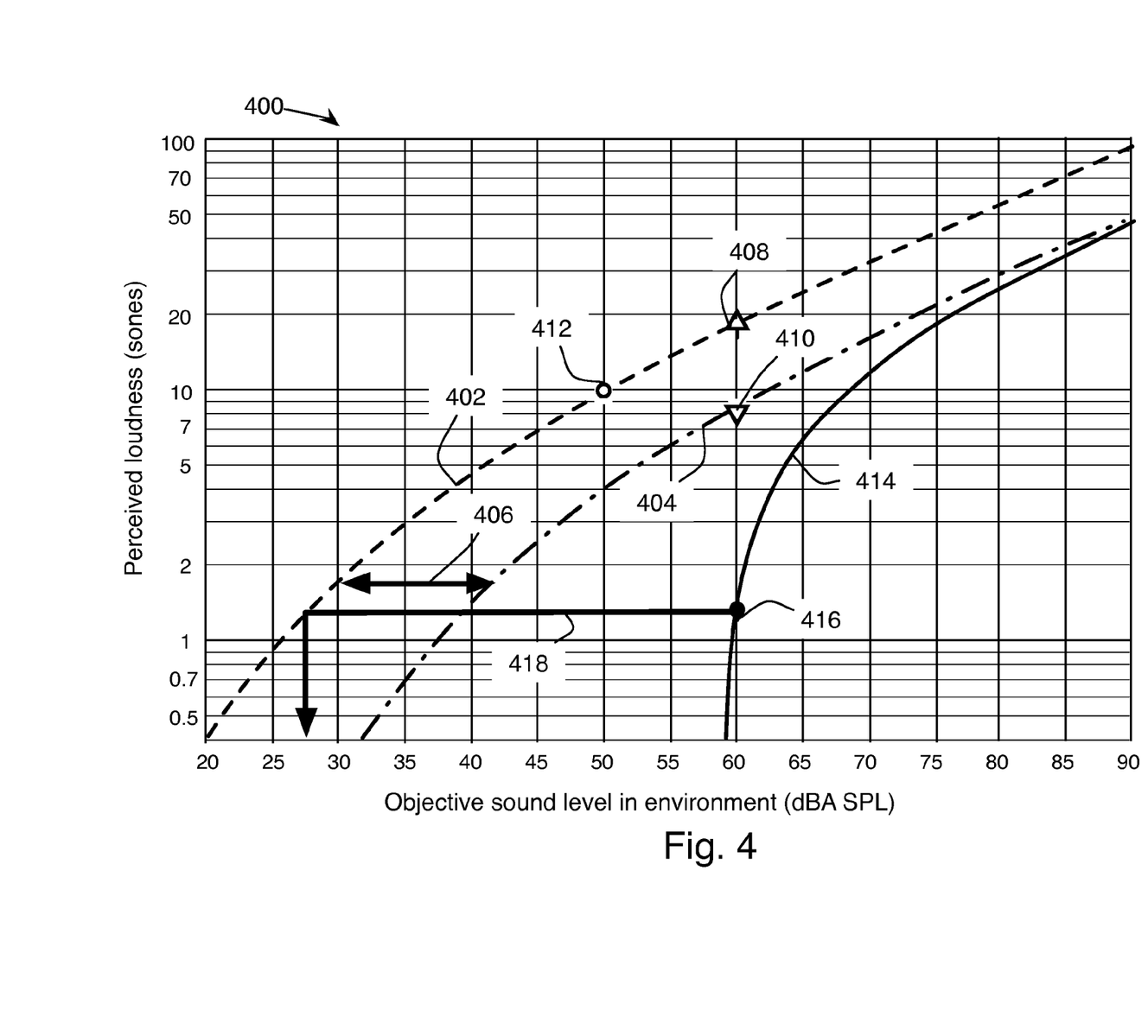

Using a speech-shaped masker in combination with active noise reducing (ANR) headphones is an ideal combination. By matching the spectrum of the distractor, the masker can be at the minimum level needed to mask speech. By using headphones, the necessary level of the masker is further reduced. In particular, an ANR headphone is preferred since the highest levels in human speech are at lower frequencies, where active attenuation is more effective than passive means. FIG. 4 shows the beneficial result in graph 400. A single-dashed line 402 shows a range of noise levels with the objective SPL on the X-axis and the corresponding perceived loudness on the Y axis as in FIG. 2. The dash-dot line 404 shows the perceived loudness of the same ambient environment if a headphone with 12 dB attenuation is worn (12 dB can be seen in the horizontal offset between the two lines 402 and 404, see marker 406). A louder open-plan office environment typically has ambient noise levels around 60 dBA (upward pointing triangle 408). The headphone on its own reduces the perceived loudness of the office noise by a bit more than half, from 19 sones at triangle 408 to 8 sones at downward pointing triangle 410. A masker signal, such as the sound of a flowing stream, set to a level of 50 dBA, is indicated by the white circle 412. The loudness of that masker is just over half as loud as the office noise would be without the headphone (19 sones at 408 vs. 10 sones at 412). The solid line 414 represents the perceived loudness as a function of level, under the headphone and in the presence of the 50 dBA masker, as calculated using Moore's partial loudness model. The black circle 416 is the resulting perceived loudness of the 60 dBA office noise; this loudness (1.3 sones as shown) corresponds to an A-weighted level of about 27 dBA (see marker 418 going left from the black circle 416 to the intersection with the dashed line 402). The combination of the 12 dB attenuation provided by the headphone and psychoacoustic effect of the 50 dBA masker reduces the perceived loudness of the office by more than a factor of 10. A slightly louder masker will make the office noise completely inaudible.

A computing device providing an auto-masking feature may include one or more audio files to be used as the source of the masking signal, such as white noise or peaceful sounds such as rain or flowing water. The masking signal may also be generated algorithmically, especially if it is a random sound like white noise or pink noise. The computing device may equalize the audio file, whether a random noise or a natural sound, to a spectrum that better-matches the spectrum of the ambient noise to be masked, for example by using a least-square adaptive algorithm, to ensure that the masking noise adaptively maintains a match to the distracting noise. Whatever the source of the masking signal, the result is to modify the signal so that, when it is acoustically summed with the distracting noise at the user's ear, a target partial loudness is achieved. The dynamics of adjusting the masker do need to be carefully considered. The level of the masker should change slowly enough that fluctuations in the audible masker signal don't become distractions themselves.

U.S. Patent Application Publication 2011/0235813, the entire contents of which are incorporated here by reference, describes comparing the envelope correlation of the ambient noise to an estimate of the at-ear signal computed from the masking and ambient noise signals, factoring in the headset attenuation and audio response, to determine the equalization and output level for the masking signal. More recently, promise has been shown in basing the masking adjustment on Moore's partial loudness model, altering the output level of the masking audio signal to force the distracting ambient noise to a target partial loudness value.

In some examples, using either an envelope correlation/speech transmission index (STI) approach or a method based on Moore's partial loudness model, the automatic masking is controlled by the user, through a user interface that allows the user to set a threshold representing the desired level of isolation from distraction balanced against acceptance of listening to the masking noise. Once this personalized threshold is established over a few use sessions in different noise environments, the user only has to turn the system on to achieve the desired ability to focus. In the case of implementations using the Moore model, this is accomplished by setting the target partial loudness of the distracting ambient sound. The automatic masking system implemented in the computing device estimates the partial loudness of the residual ambient noise under the headset, based on the ambient noise measured by the microphone on the headset and the spectrum and level of the masker output by the device, after factoring in the known headphone attenuation and audio response as communicated to the device. The system then adjusts the masker level so as to converge on the target. The masking system may also implement a partial loudness target that varies with ambient level, since people tolerate more distractor intrusion into their consciousness in louder environments so as to not have to listen to a loud masker. The user interface may allow the user to adjust the slope of the target partial loudness versus ambient level dependence; the slope may be estimated by the system based on target partial loudness adjustments done by the user in different noise levels, or this slope may be fixed with the system estimating an offset representing the user's preferred target partial loudness at some reference noise level.

Another feature that can be provided is referred to herein as "Music DNC." Music DNC adjusts a music signal to maintain the correct perceived partial loudness and spectral balance, or what Moore calls "specific loudness," the loudness as a function of perceptual frequency, in the presence of residual ambient noise inside the headphone. One solution to providing Music DNC is described in U.S. Pat. No. 8,090,120. Music DNC provides multi-band upward compression of the quieter portions of the music, as illustrated in FIGS. 5-7.

Figure 5:
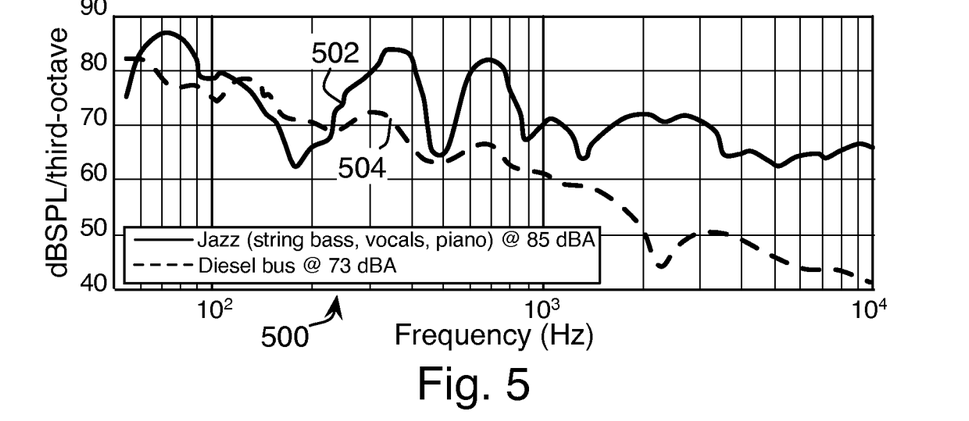

FIG. 5 shows a graph 500 of the initial music and noise spectra. Jazz music including string bass, vocals, and piano is shown by solid line 502. The noise of a Diesel bus is shown by dashed line 504. Both lines are third-octave smoothed and show the energy per third-octave-wide band. The music is set to a moderately loud level of 85 dBA, and the noise is at a level typically encountered on a bus, 73 dBA.

Figure 7:
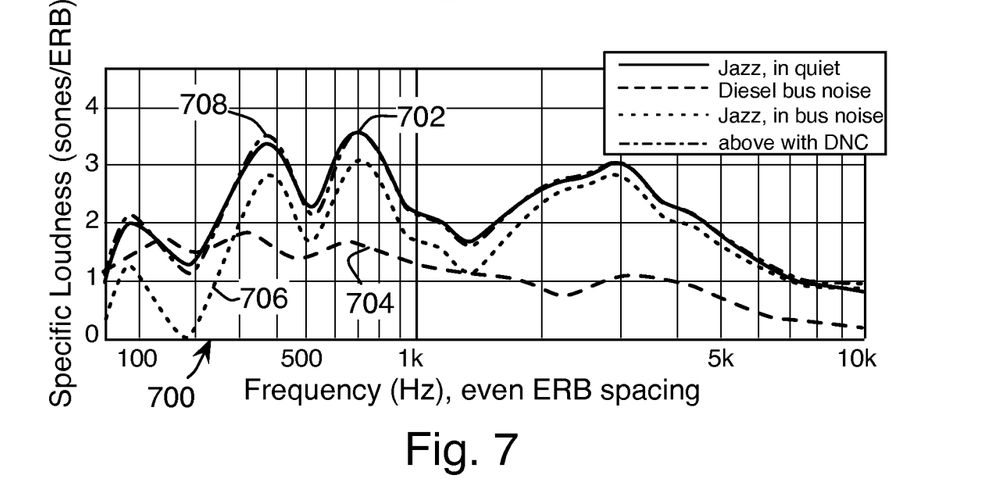

FIG. 7 shows a graph 700 of the specific loudness, aka the density of loudness (in sones) per unit of perceptual frequency (a critical band, called an ERB in Moore's model). The frequency axis is labeled with objective frequency (Hz) but warped to be spaced in ERBs; this shows how critical bands widen at lower frequencies. The solid curve 702 is the specific loudness of the music from FIG. 4 as if listened to in quiet, while the bus noise is represented by the dashed curve 704. The dotted curve 706 shows the specific partial loudness of the music in the noise; i.e., the equivalent loudness of the music as it is altered by the presence of the noise. FIG. 5 shows that the objective level of the music is about the same as that of the bus below 250 Hz. This low signal to noise ratio (SNR) at low frequencies reduces the apparent loudness of the music as shown in FIG. 7; below 100 Hz the string bass is half as loud as it would be if listened to in quiet. At 200 Hz, any content in the music is inaudible.

Figure 6:
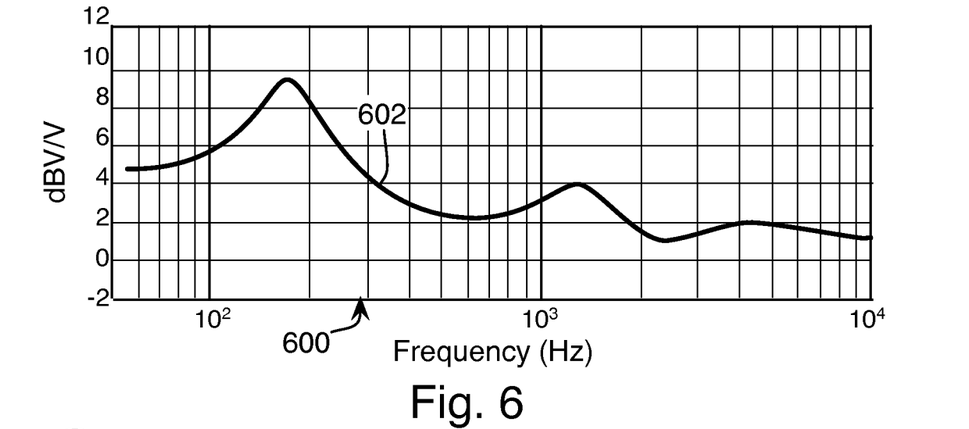

The curve 602 in graph 600 in FIG. 6 is an EQ response that approximately restores the music's timbre in the presence of the bus noise. Applying that equalization to the music results in the dash-dot curve 708 in FIG. 7, showing the partial specific loudness, as computed with Moore's model. Note that the equalized curve 708 comes very close to the solid curve 702, the music as it would sound in quiet.

The approach described in the U.S. Pat. No. 8,090,120 mentioned above could be used to determine the equalizer curve 602 for a given set of music and noise conditions.

A Music DNC algorithm boosts the music, as shown by comparing curve 708 to curve 706. Rather than a uniform boost in dB, the Music DNC algorithm boosts the music differently at different frequencies, based on the spectrum of both the music and the noise, to ensure that the partial specific loudness of the music in the presence of the ambient noise approximately matches the specific loudness of the music, that is, how the music sounds against a quiet background. Even where the level of the music was already greater than the noise, the masking effect of the noise lowers the partial specific loudness of the music below where it would be without the noise, so the Music DNC algorithm raises the level. Music DNC may be used with any content, not just music, where it is desired to preserve the spectral balance of the audio signal, such as spoken word audio.

Figure 8A:
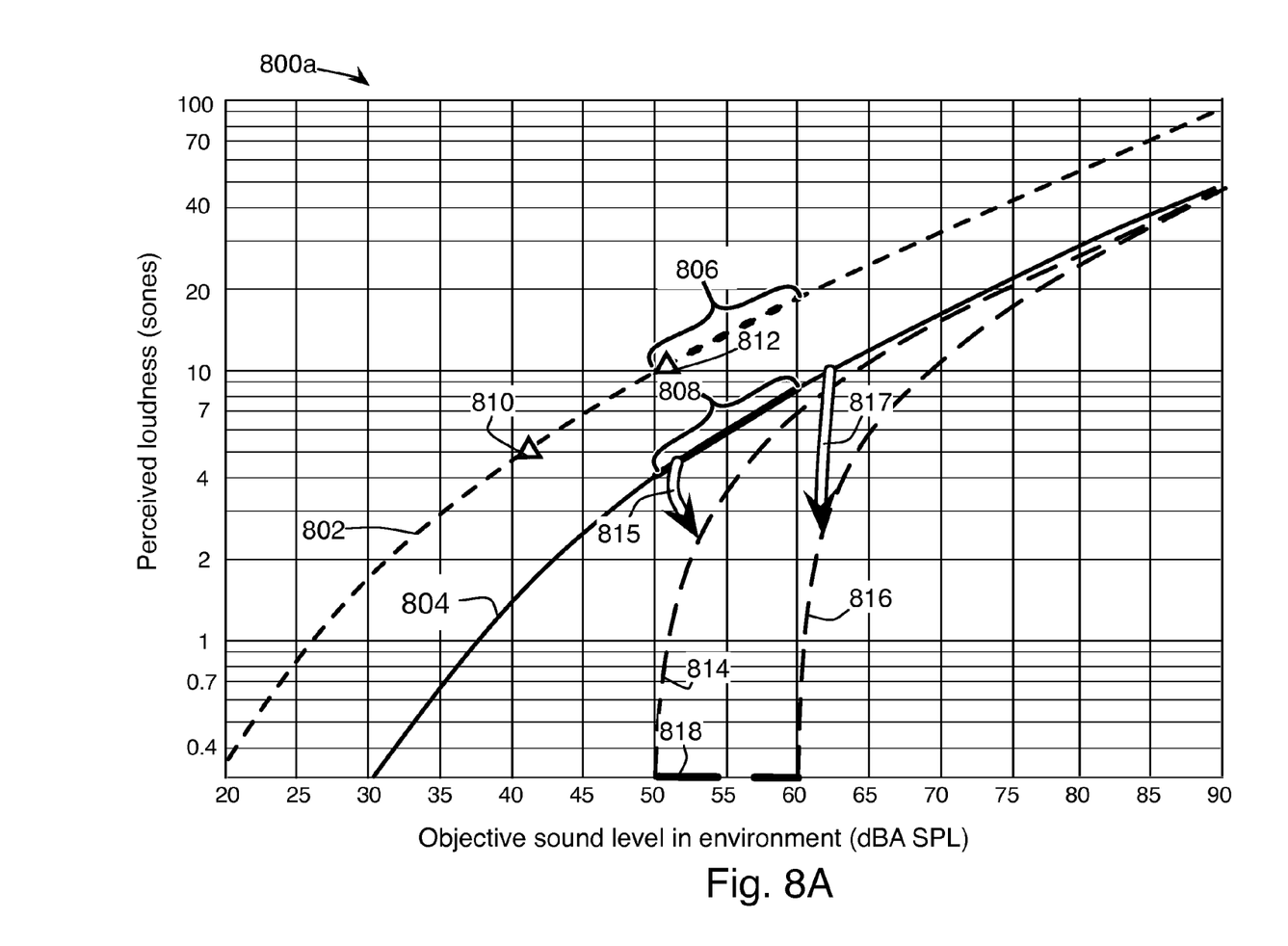
Figure 8B:
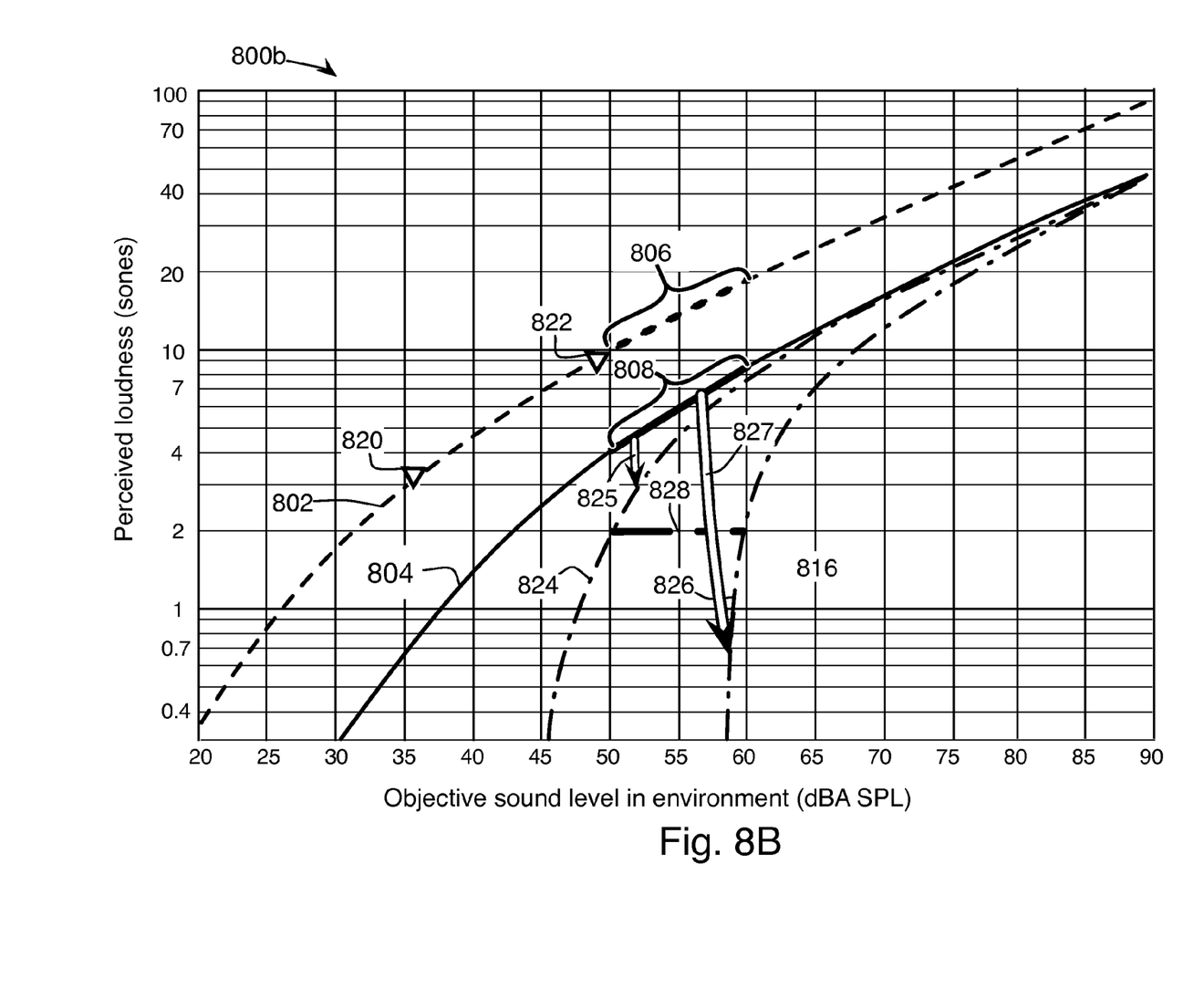

In some examples, dynamic processing algorithms resident in a computing device have parameters that adjust the algorithms' behavior. For example, the parameters may be adjusted to provide a desired perceived loudness level for the ambient environment in an auto-masking feature. FIGS. 8A and 8B show graphs 800a and 800b of the relationship between objective sound in the environment and the perceived loudness of that sound using two different user preferences. In both graphs, the short-dashed line 802 represents the ambient loudness/level relationship, i.e., it is the same as line 402 in FIG. 4. The solid line 804 represents the loudness/level relationship under a set of headphones providing 12 dB of attenuation, like line 404 in FIG. 4. The thick regions 806 and 808 of those two lines, respectively, represent the assumed variation in ambient level experienced in an environment such as an open-plan office, ranging from 50 to 60 dBA.

FIG. 8A shows the effect of relatively louder masker sounds. The upward pointing triangles 810 and 812 represent the lower and upper extremes of a range of masker sounds meant to provide a large level of isolation from distractions. These masker sounds have levels of just above 40 and just above 50 dBA, resulting in perceived loudnesses of 5 and 10 sones. The levels of these sounds result from setting the auto-masker algorithm to maintain a partial loudness of 0.3 sones, which is very quiet (equivalent to an office babble of 18 dBA). The long-dashed lines 814 and 816 correspond to the partial loudness under the headphones vs the ambient level when using those extremes of the louder masker range at the corresponding ambient upper and lower limits. Arrows 815 and 817 illustrate the change in perceived loudness from curve 804 to curves 814 and 816 in the presence of masker sounds at 810 and 812, respectively. Note that the ends of each of curves 814 and 816 correspond to 0.3 sones, as shown by the thick long-dashed line 818 along the bottom edge of the graph. For curve 816, representing the loudest level masker within this louder masker range, the ambient noise region is completely off the bottom of the graph.

FIG. 8B shows the effect of relatively quieter masker sounds. The downward pointing triangles 820 and 822 represent the lower and upper extremes of a range of masker sounds meant to provide less isolation. At just above 35 dBA and just below 50 dBA, resulting in perceived loudnesses of 3 and 9 sones, respectively, these maskers correspond to a partial loudness target of 2 sones (equivalent to an office babble of about 43 dBA). The dash-dot curves 824 and 826 show the partial loudness under the headphones vs the ambient level when using the extremes of the quieter masker sounds at the corresponding upper and lower limits. Arrows 825 and 827 illustrate this change. Within the ambient noise range of 50 to 60 dBA, the quieter masking sounds result in the ambient noise having the target perceived loudness of 2 sones, as shown by the thick dash-dot line 828. With the louder end of these quieter masking sounds, most of the ambient sound is still off the chart, with only the loudest sounds, at 60 dBA objective level, audible, and they are reduced to the target 2 sones of perceived loudness.

In such a system, the user won't directly be setting a "masking level" per se, but will in most examples adjust a control labeled something like "target distraction level." The target distraction level selected by the user corresponds to a perceived loudness, i.e., a position on the vertical axis between the 0.3 sones perceived ambient loudness provided by the loudest masker range, and the 2 sones perceived ambient loudness provided by the quietest masker range. The maskers are set to a range that will result in loudness/level curve somewhere between the curves 814 and 826, with the upper and lower limits crossing the 50 dBA and 60 dBA lines at the loudness level corresponding to the target distraction level.

Over time, the software can learn its user's preferences for such a setting by observing the adjustments the user makes after the masking is activated. Given this learning and sufficient information about the performance of different headphones and the ambient noise, the user need only turn the system on and the algorithm will automatically provide the user's preferred target distraction level in any headphone the user chooses. If the computing device is connected to the Internet, then individual users' preferences can communicated back to a central server, which can then crowd-source knowledge about what settings work best for each headphone model in use in the community of users. That knowledge can then be downloaded to computing devices for use as default settings when their user acquires a new set of headphones. For example, if most users that attach a particular model of headphones to their smart phone turn target distraction level down by an amount that lowers the masker level by 6 dB, then the default starting point for new users can be pre-adjusted 6 dB lower than it was for the earlier users.

In other examples, a single user may want to hear a different amount of ambient noise at different times. Software can learn target distraction level settings as a function of the headphones used, as the user's use case and therefore preferences may vary between headphone models. For example, a user may use a set of over-ear headphones when he wants to block all ambient noise, as shown by the curves 804, 814, 816, 824, and 826 when the user is on an airplane or when sitting at a desk. Conversely, the same user may wear a set of in-ear sport headphones when outside running, and wants to hear some of the environment for safety reasons. A similar set of curves for headphones that have low attenuation would be closer to the open-ear curve 802, effectively shifted upward and to the left relative to the curves for the noise-blocking headphones. It is preferable that each headphone communicate its own attenuation response for use by the computing device, which can then observe whether the headphone is meant to be isolating or not and adjust accordingly. If the headphone is not attenuating, the algorithm may not be able to estimate the loudness of the residual noise inside the headphones, so it may fall back to normal operation, needing the user to set the level of the masker signal. However, even if the computing device only knows that a different headphone is used, and can keep track of those different headphones, it can observe that the user typically makes the same adjustments when switching between the different headphones, and automatically make those adjustments the next time the same headphones are connected. Other data may also be used to make such adjustments. Many portable computing devices are equipped with location detecting circuits, such as GPS receivers, and with sensors such as accelerometers and magnetometers. They may also keep track of nearby wireless networks as a means of determining location, even if the device doesn't use those networks. All of these inputs can be correlated to the adjustments the user makes to masking levels, so even if the user uses the same set of headphones for two different activities, the adjustments can be made automatically based on the user's location.

Figure 9:
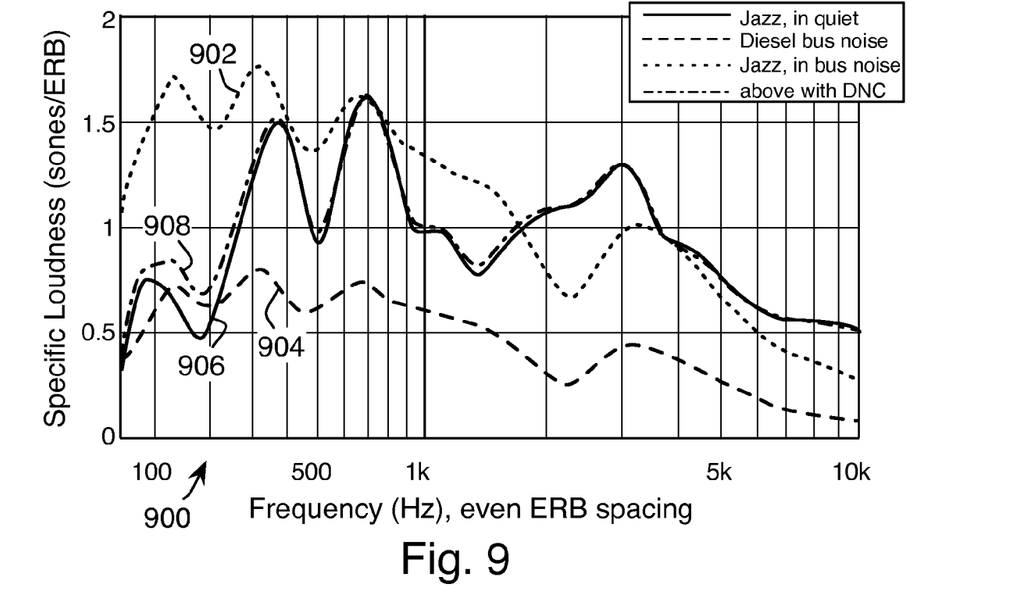
Figure 10:
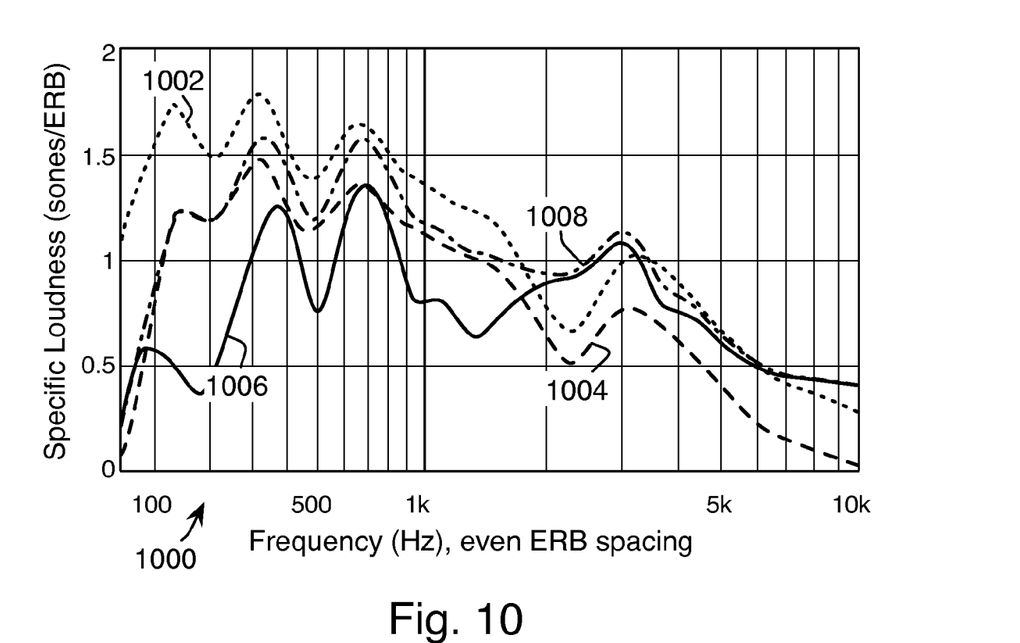

An additional feature of multi-mode volume control can be provided in a system that also has the ability to provide active hear through (a modified feed-forward filter to provide ambient sound at the ear, bypassing passive and feedback-based active attenuation), as described in U.S. patent application Ser. No. 13/667,103, incorporated here by reference. Active hear through may be configured to provide ambient sound at the ear with any targeted attenuation amount less than the full capability of a headphone. As discussed above, automasking algorithms can adjust audio to mask residual ambient noise to any targeted perceived loudness, while Music DNC can adjust the desired audio to any perceived loudness (with correct perceived spectral balance) in the presence of residual noise. By combining an adjustable active hear through with music DNC, as shown in FIGS. 9 and 10, controls can be provided that (1) adjust the loudness of the sum total of what the user hears and (2) shift the audio the user is listening to from foreground to background in the user's attention. That is, the user can control whether audio is dominant or ambient is dominant, without completely eliminating either one, if desired. As in FIG. 7, the horizontal axes in FIGS. 9 and 10 show frequency in ERBs, rather than in a uniform logarithmic scale. Both graphs 900 and 1000 show a scenario in which the user is riding on a bus and wants to listen to music quietly while reflecting on his day. Two different cases are shown; each graph shows the partial loudness (sones per ERB) so that the area under a curve is the net loudness for that signal. In both graphs the ambient bus noise is the dotted line (902, 1002), the dashed line (904, 1004) is the residual noise inside the headphone after the active hear through feature has filtered and passed some of the ambient noise, the solid line (906, 1006) is the music and the dash-dot line (908, 1008) is the net sum of what the users hears, i.e., the residual ambient noise plus the music. The bus noise 902, 1002 and music 906, 1006 are the same signals used to generate FIGS. 5 and 7.

In FIG. 9, the user is riding the bus, thinking. They want to hear their music and have little awareness of the bus noise, but they want their music to be quiet so they can think as well. In this case, the active hear through is set to provide reasonable attenuation (15 dB in the example, or about ⅓ in loudness, as can be seen by the ratio of the ambient curve 902 to the residual curve 904 at any frequency). Note that the sum of music and noise curve 908 is similar to the music only curve 906. Little Music DNC would have to be applied in this case.

In FIG. 10, the user has realized they are approaching their destination. They want to keep their music on but also hear announcements from the bus driver and be able to speak to people near them. So they set the controls for a balanced music and ambient awareness, each with the same loudness. But, they haven't adjusted their overall loudness. The active hear-through is also set to mainly pass speech, aggressively attenuating rumble below 125 Hz and gently attenuate above 4 kHz, see line 1004. Multi-mode volume control automatically adjusts the passband of the active hear-through to provide slight attenuation and reduce the music by the same amount so that the combined loudness 1008 remains relatively constant. Aggressive Music DNC EQ is also applied to maintain the partial specific loudness of the music. The area under the combined music and noise curves 908 and 1008 in both plots is the same, 34 sones, which for these signals, corresponds to about 70 dBA.

In some examples, the user is enabled to separately adjust the foreground/background control for different audio streams or to set priority preferences. For example, when the user is listening to music while walking down the street, he might want his music and his ambient environment in balance, with neither commanding more attention. When the user takes a call, the music is moved very far into the background relative to residual ambient noise, but continues to play, while the call is heard dominantly in the foreground relative to the residual ambient. This ensures ease of understanding during the phone conversation. At the same time, when the call comes in and music and residual ambient are shifted toward the background relative to the call, the total loudness heard can be kept constant. All of this is enabled by basing the level and equalization of the music and call on a partial loudness model.

Masking, ANR, and source mixing can also be controlled differently for each ear. For example, a user may have active hear through with light masking enabled so that he can hear his environment, but when he answers a call, one ear switches into noise reduction mode to place the ambient noise at that ear in the far background while placing the call in the foreground. The other ear remains in active hear-through mode to continue to provide situational awareness during the call. These features are generally independent of the source, so it may be advantageous to provide the requisite signal processing within the headphones themselves, as mentioned above.

While basing a Music DNC or auto-masking algorithm on a perceptually accurate loudness model is most desirable, less computationally intense approaches can be implemented based on measurements of the SPL in the environment and estimates of the SPL as heard under the headphone. For example, an auto-masking algorithm might be set to maintain a target masker-to-residual noise frequency-weighted SNR. A Music DNC algorithm might use an estimate of the residual noise and some estimate of the balance of low and high frequencies in the noise using as few as two frequency bands to determine how to equalize the music over a small number of frequency bands.

Other implementations are within the scope of the following claims and other claims to which the applicant may be entitled.

What is claimed is:

1. An apparatus comprising:
   a set of headphones for outputting sounds corresponding to input audio signals, the set of headphones providing at least 12 dBA attenuation of ambient sound at a user's ear; and
   a programmable signal processor configured to provide a signal that when reproduced by the set of headphones provides a masking sound at the user's ear with a spectral density that is flat from 200 Hz to 500 Hz, falls off with a slope of about 8 dB/octave above 500 Hz, and falls off with a slope of about 20 dB/octave below 100 Hz.

2. The apparatus of claim 1 further comprising a microphone for generating an ambient audio signal representing the ambient noise in the vicinity of the headphones, wherein the signal processor is configured to provide the masking sound at a level such that resulting partial loudness of the residual noise at the user's ear is at least ten times less than the residual noise level in the absence of the masking sound.

3. The apparatus of claim 1, wherein the signal processor is integrated into the set of headphones.

4. An apparatus comprising a media playback device with programmable signal processing capabilities and an input receiving signals representative of ambient noise, wherein the media playback device is configured to:
   identify an output response characteristic and an attenuation characteristic of a set of headphones associated with the media playback device,
   predict a property of audio output by the headphones at a user's ear based on the ambient noise input signal, the output response characteristic, and the attenuation characteristic of the headphones,
   predict expected residual ambient noise at the user's ear, when wearing the headphones, derived from the ambient noise input signal and the attenuation characteristic, and
   modify masking audio signals to be provided to the headphones such that they will mask the expected residual ambient noise at the user's ear,
   wherein the media playback device further modifies the masking signals so that the masking signals cause the residual ambient noise to have a partial loudness that increases monotonically in a pre-determined way with increases in the ambient noise level.

5. The apparatus of claim 4, wherein modifying the masking signals includes equalizing the masking signals to have a spectral characteristic that matches a spectrum of the expected residual ambient noise at the user's ear.

6. The apparatus of claim 4, wherein modifying the masking signals includes setting a level of the masking signal to control a partial loudness of the expected residual ambient noise at the user's ear.

7. The apparatus of claim 4, wherein the media playback device modifies the masking signals based on the expected residual ambient noise and the output response characteristic such that the masking signals cause the expected residual ambient noise to have a pre-determined partial loudness at the user's ear.

8. The apparatus of claim 4, wherein the increase in the partial loudness of the residual ambient noise is less than would occur if the level of the masking signals were held constant as ambient noise level increases.

9. The apparatus of claim 4, wherein modifying the masking signals includes setting a level of the masking signal to have a predefined relationship to an average level of the expected residual ambient noise at the user's ear.

10. The apparatus of claim 9, wherein
   the predefined relationship is based on a user input value, and
   the media playback device modifies the masking signals to mask the expected residual ambient noise according to the user input value when a first set of headphones is coupled to the media playback device, and
   the media playback device modifies the masking signals to have the same predefined relationship to the average level of the expected residual ambient noise without receiving further user input when a second set of headphones having different response characteristics than the first set of headphones is coupled to the media playback device.

11. The apparatus of claim 9, wherein
the predefined relationship is based on a first user input value, and
the media playback device modifies the masking signals to mask the expected residual ambient noise according to the user input value when a first set of headphones is coupled to the media playback device, and
the media playback modifies the masking signals to have a different predefined relationship to the average level of the expected residual ambient noise based on a second user input value when a second set of headphones having different response characteristics than the first set of headphones is coupled to the media playback device.

12. The apparatus of claim 4, wherein modifying the masking audio signals is dynamic.

13. The apparatus of claim 4, wherein identifying the attenuation characteristic comprises assuming the headphones do not attenuate the ambient noise.

14. The apparatus of claim 4, wherein the media playback device receives a user input adjusting the modification of the audio masking signals, associates the user input adjustment with a model of the headphones, and transmits data describing the adjustment and the headphone model to a server with which the media playback device is in communication.

15. The apparatus of claim 4, wherein the media playback device is also configured to identify an input response characteristic of a microphone providing the signals representative of the ambient noise, and the modification of the audio masking signals is further based on the input response characteristic of the microphone.

16. The system of claim 15, wherein the microphone is coupled to the headphones.

* * * * *